US012405295B2

(12) United States Patent
Hu et al.

(10) Patent No.: US 12,405,295 B2
(45) Date of Patent: Sep. 2, 2025

(54) DETECTION DEVICE

(71) Applicant: SHENZHEN EVERBEST MACHINERY INDUSTRY CO., LTD., Guangdong (CN)

(72) Inventors: Zhaojie Hu, Guangdong (CN); Zhijian Huang, Guangdong (CN)

(73) Assignee: SHENZHEN EVERBEST MACHINERY INDUSTRY CO., LTD., Shenzhen (CN)

(*) Notice: Subject to any disclaimer, the term of this patent is extended or adjusted under 35 U.S.C. 154(b) by 218 days.

(21) Appl. No.: 18/204,404

(22) Filed: Jun. 1, 2023

(65) Prior Publication Data
US 2024/0255553 A1 Aug. 1, 2024

(30) Foreign Application Priority Data

Jan. 31, 2023 (CN) .......................... 202320273804.3

(51) Int. Cl.
*G01R 19/25* (2006.01)
*G01R 1/04* (2006.01)
*G01R 15/12* (2006.01)
*G01R 19/15* (2006.01)
*G01V 11/00* (2006.01)

(52) U.S. Cl.
CPC .......... *G01R 19/2503* (2013.01); *G01R 1/04* (2013.01); *G01R 19/15* (2013.01); *G01V 11/002* (2013.01)

(58) Field of Classification Search
CPC .. G01R 19/25; G01R 19/2503; G01R 19/145; G01R 19/15; G01R 1/02; G01R 1/04; G01R 15/12; G01R 15/125
See application file for complete search history.

(56) References Cited

FOREIGN PATENT DOCUMENTS

| CN | 2879201 Y | * | 3/2007 |
| CN | 214041510 U | * | 8/2021 |

* cited by examiner

*Primary Examiner* — Douglas X Rodriguez
*Assistant Examiner* — Kendrick X Liu
(74) *Attorney, Agent, or Firm* — Fideli Law PLLC; Qiang Li

(57) ABSTRACT

A detection device includes a housing, a wall detection assembly, a multimeter assembly, and a circuit setting layer. The wall detection assembly includes a wall detection processing circuit and a sensor assembly. The multimeter assembly includes a multimeter measurement circuit. Both the circuit setting layer and the sensor assembly are located inside the housing. The housing consists of a top housing and a bottom housing that fit together. The circuit setting layer has a first setting surface facing the bottom housing, which includes a first setting area and a second setting area partitioned for different functions. The wall detection processing circuit is located in the first setting area, and the multimeter measurement circuit is located in the second setting area. The sensor assembly is located in the bottom housing and positioned opposite the first setting area.

11 Claims, 5 Drawing Sheets

DETECTION DEVICE

CROSS REFERENCE TO RELATED APPLICATIONS

The present application claims the benefit of Chinese Patent Application No. 202320273804.3 filed on Jan. 31, 2023, the contents of which are incorporated herein by reference in their entirety.

TECHNICAL FIELD

This invention belongs to the technical field of electronic detection tools, more specifically, it is related to a detection device.

BACKGROUND ART

In the decoration project of the building, the use of wall detectors and digital multimeters is involved. The wall detector is used to detect the specific location of metal structures, wooden structures and electrical wiring inside the wall, such as the location of metal pipes, steel bars, wooden beams, and lighting circuits. The digital multimeter is used to detect whether the electrical parameters including voltage, current and resistance of each laying circuit are normal, as well as to detect whether each wiring is correctly configured to ensure the safety of the use of electricity inside and outside the building.

In the existing technology, wall detector dedicated to wall detection, digital multimeter dedicated to circuit detection. In the detection operation of the decoration project, the user holds the wall detector and the digital multimeter to respectively detect the wall. Separate control increases the workload of the user, and makes the detection work cumbersome and complex, which does not facilitate the simplification of work and the lightness of carrying weight.

Furthermore, in the preparation of the detection operation, the wall detector and digital multimeter must be purchased separately and carried separately, so we must take the carrying space into account, resulting in increase of the user's purchase cost and decrease of carrying portability.

SUMMARY OF THE INVENTION

The purpose of the present invention is to provide a detection device to solve the technical problems of complexity in detecting work and high purchase cost and low portability of existing wall detectors and multimeters that require separate operations.

According to the invention, the detection device is proposed.

The detection device comprises a housing, a wall detection assembly, a multimeter assembly, and a circuit setting layer.

The wall detection assembly comprises a wall detection processing circuit and a sensor assembly, the multimeter assembly comprises a multimeter measurement circuit, and the circuit setting layer and the sensor assembly are both located inside the housing.

The housing comprises a top housing and a bottom housing that fit together, the circuit setting layer has a first setting surface facing the bottom housing, the first setting surface has a first setting area and a second setting area partitioned thereon. The wall detection processing circuit is located in the first setting area, the multimeter measurement circuit is located in the second setting area, the sensor assembly is located in the bottom housing, and the sensor assembly is positioned opposite the first setting area.

The sensor assembly is electrically connected to the wall detection processing circuit, the sensor assembly is configured to obtain detection parameters of a wall to be detected and transmit the detection parameters to the wall detection processing circuit for processing, and the multimeter measurement circuit is configured to receive detection signals from test leads of multimeter and process the detection signals.

In an embodiment of the present invention, the sensor assembly and the wall detection processing circuit are spaced apart along the direction in which the top housing and the bottom housing are engaged, and the sensor assembly and the wall detection processing circuit form a gap therebetween.

In an embodiment of the present invention, the sensor assembly includes a metal detection sensing element, a foreign object detection sensing element, and an AC voltage signal sensing element. The wall detection processing circuit includes a wall detection control unit, a metal detection processing circuit, a foreign object detection processing circuit, and an AC voltage signal processing circuit. The metal detection processing circuit, the foreign object detection processing circuit, and the AC voltage signal processing circuit are respectively electrically connected to the wall detection control unit.

The metal detection sensing element is electrically connected to the metal detection processing circuit, and the metal detection sensing element is used to obtain the metal parameters of the wall to be detected and transmit them to the metal detection processing circuit;

The foreign object detection sensing element is electrically connected to the AC voltage signal sensing element, and the foreign object detection sensing element is used to obtain the foreign object parameters of the wall to be detected and transmit them to the foreign object detection processing circuit;

The AC voltage signal sensing element is electrically connected to the AC voltage signal processing circuit, and is used to obtain the AC voltage signal of the wall to be detected and transmit it to the AC voltage signal processing circuit.

In an embodiment of the present invention, the foreign object detection sensing element and the AC voltage signal sensing element are configured to be formed in one component, and the wall detection processing circuit further includes a first interface structure and a second interface structure which are arranged in the first setting area.

The metal detection sensing element is electrically connected to the metal detection processing circuit via the first interface structure, the foreign object detection sensing element is electrically connected to the foreign object detection processing circuit via the second interface structure, and the AC voltage signal sensing element is electrically connected to the AC voltage signal processing circuit via the second interface structure.

In an embodiment of the present invention, the wall detection control unit is located in the central area of the first setting area, and the metal detection processing circuit and the AC voltage signal processing circuit are located in the area of the first setting area away from the second setting area.

And the metal detection processing circuit, the foreign object detection processing circuit, and the AC voltage signal processing circuit are sequentially arranged outside the wall detection control unit in a clockwise direction.

In an embodiment of the present invention, the multimeter measurement circuit comprises a multimeter control unit and a multimeter processing circuit electrically connected to the multimeter control unit;

The multimeter control unit is located in an area on the second setting area near the first setting area, and the multimeter measurement circuit is located in an area on the second setting area away from the first setting area.

In an embodiment of the present invention, the bottom housing has a first housing cavity on a surface facing the top housing and a second housing cavity on a surface opposing the top housing, and the first housing cavity and the second housing cavity are spaced apart, the detection device further comprising a battery structure, which supplies power to the wall detection assembly and the multimeter assembly;

The first housing cavity is located opposite to the first setting area and the second housing cavity is located opposite to the second setting area, the sensor assembly is located inside the first housing cavity and mounted on the bottom wall of the first housing cavity, and the battery structure is located inside the second housing cavity.

In an embodiment of the present invention, the wall detection assembly further comprises a first linear regulator, the multimeter assembly further comprises a second linear regulator, the wall detection processing circuit is electrically connected to the battery structure via the first linear regulator, and the multimeter measurement circuit is electrically connected to the battery structure via the second linear regulator.

In an embodiment of the present invention, the wall detection assembly further comprises a first display device, the wall detection processing circuit is electrically connected to the first display device, and the first display device is configured to display the characteristic parameters processed by the wall detection processing circuit for the detection parameters;

The multimeter assembly further comprises a second display device, the multimeter measurement circuit is electrically connected to the second display device, and the second display device is configured to display characteristic signals processed by the multimeter measurement circuit for the detection signals;

The first display device and the second display device are both provided on a lateral side of the top housing away from the bottom housing, the first display device and the second display device being arranged in sequence, the first display device corresponding to the first setting area and the second display device corresponding to the second setting area.

In an embodiment of the present invention, the circuit setting layer is a grid structure;

And the circuit setting layer is a copper hollow layer.

Compared to the prior art, the detection device provided in this embodiment includes a housing, a wall detection assembly, a multimeter assembly, and a circuit setting layer, with the wall detection assembly and multimeter assembly integrated and arranged in the housing.

The housing includes a top housing and a bottom housing that mate with each other along a first direction, while the circuit setting layer has a first setting surface facing the bottom housing. The first setting surface has a first setting area and a second setting area partitioned along a second direction.

Therefore, the wall detection processing circuit is placed in the first setting area, while the multimeter measurement circuit is placed in the second setting area, based on the circuit setting layer as the base layer, in order to separate the parts that may interfere with each other in the wall detection assembly and the multimeter assembly into two different areas, thereby isolating the mutual interference and adverse effects of the two different detection functions. The sensor assembly is placed in the bottom housing and is spaced apart from the first setting area, in order to avoid adverse effects of the circuit structure on the sensing and detection of the sensor assembly, thereby achieving the integration of wall detection and multimeter functions in a single device.

The beneficial effects of the detection device provided in this embodiment are:

Firstly, the circuit setting layer is used as the base layer to isolate and prevent interference between the wall detection assembly and the multimeter assembly, which have interfering parts in different areas, thereby achieving the integration of wall detection and multimeter functions in one device without interference.

Secondly, the integration of wall detection and multimeter functions in one device reduces the workload of the operator who no longer needs to hold two devices separately for wall detection, which is advantageous for simplifying work and reducing the weight of the load.

Thirdly, in the preparation work of the detection operation, there is no need to separately purchase a wall detection instrument and a digital multimeter, which reduces the user's purchasing cost and increases the portability of the device.

BRIEF DESCRIPTION OF THE DRAWINGS

In order to more clearly describe the technical solutions of the embodiments of the present invention, the accompanying drawings required in the embodiments or prior art will be described briefly below. It should be understood that the following accompanying drawings illustrate only some embodiments of the present invention and therefore should not be construed as a limitation on the scope thereof. For a person of ordinary skill in the art, other relevant accompanying drawings can also be obtained from these accompanying drawings without any creative effort.

LIST OF REFERENCE NUMERALS

Figure 1:
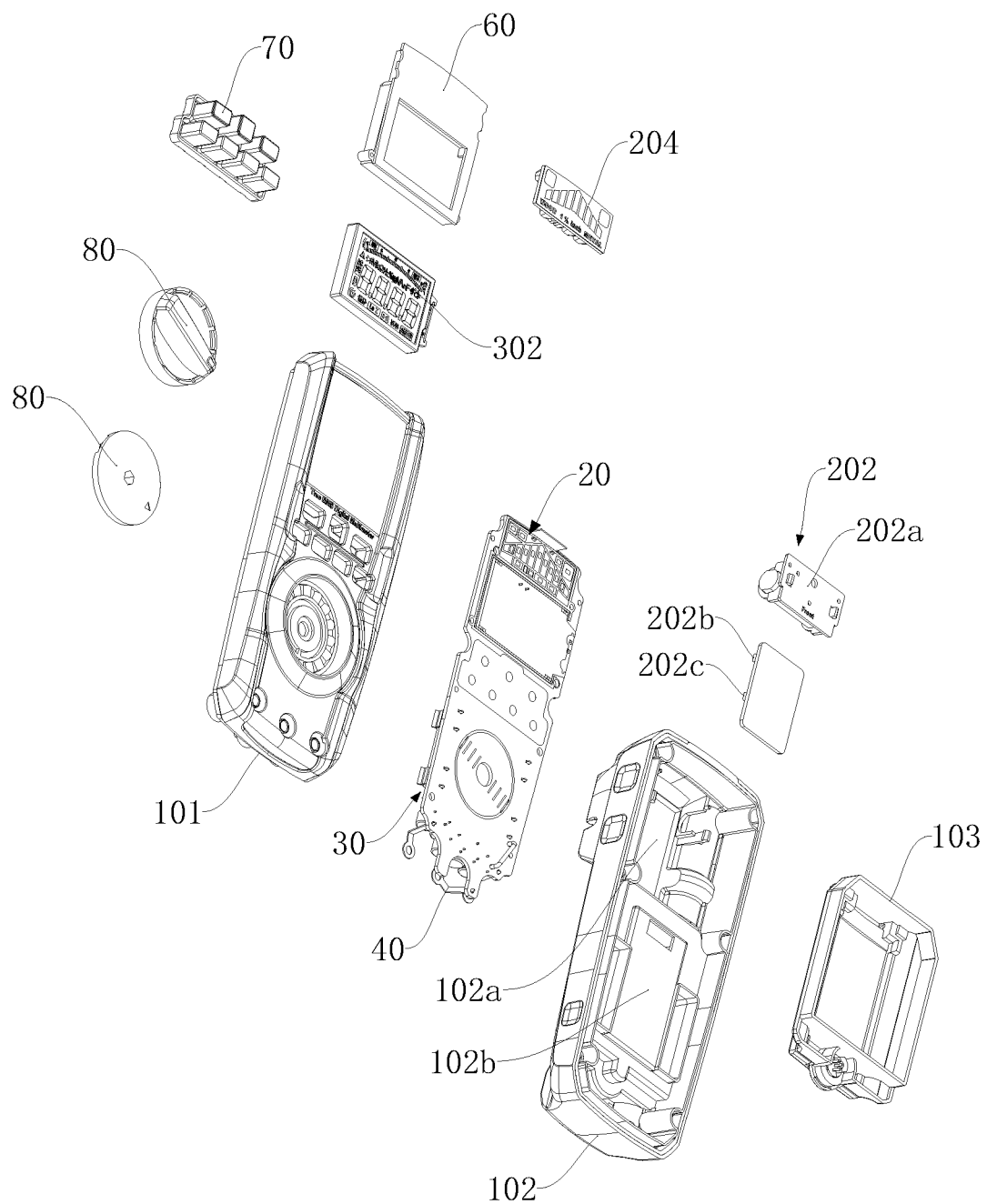
FIG. 1 is an exploded view of the detection device provided in an embodiment of the present invention.
Figure 2:
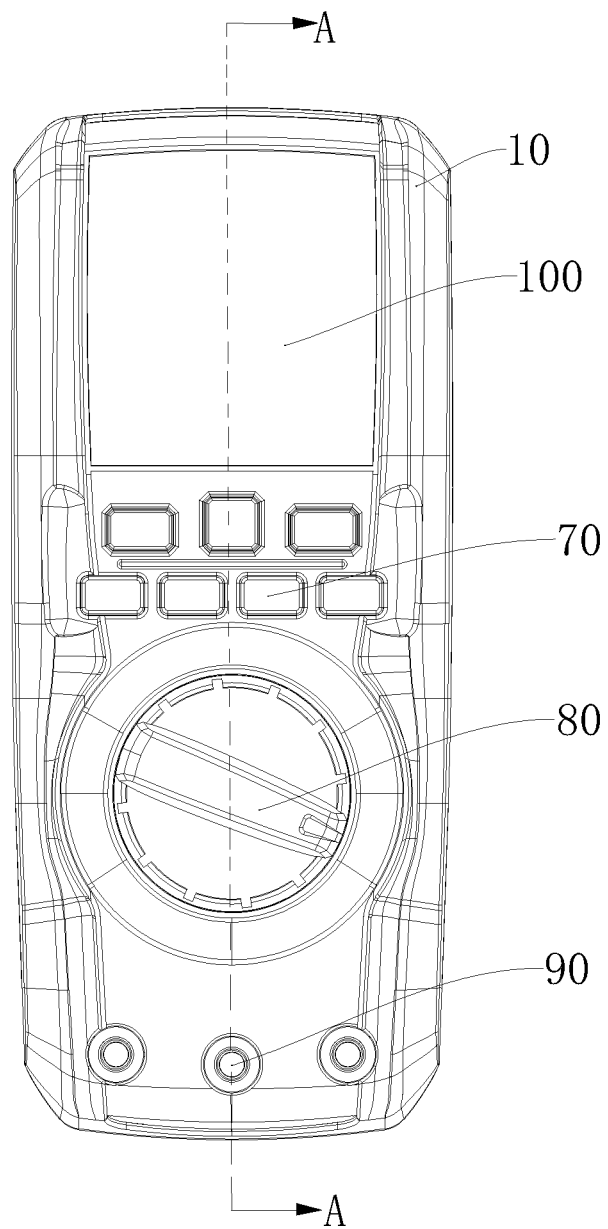
FIG. 2 is a front side view of the detection device provided in an embodiment of the present invention.

10, housing; 20, wall detection assembly; 30, multimeter assembly; 40, circuit setting layer; 50, battery structure; 60, mounting panel; 70, keypad assembly; 80, rotary knob; 90, input terminals for test lead;

101, top housing; 102, bottom housing; 103, battery housing; 102a, first holding slot; 102b, second holding slot;

201, wall detection processing circuit; 202, sensor assembly; 204, first display device; 201a, wall detection control unit; 201b, metal detection processing circuit; 201c, foreign object detection processing circuit; 201d, AC voltage signal processing circuit; 202a, metal detection sensing element; 202b, foreign object detection sensing element; 202c, AC voltage signal sensing element; 203a, first interface structure; 203b, second interface structure;

301, multimeter measurement circuit; 302, second display device; 301a, multimeter control unit; 301b, multimeter processing circuit;

401, first setting surface; 402, second setting surface; 401a, first setting area; 401b, second setting area; 402a, first display control area; 402b, second display control area; 402c, keypad control area; 402d, Rotary knob control area; 402e, test lead contact control area.

DETAILED DESCRIPTION OF EMBODIMENTS

In order to make the technical problems, technical solutions and beneficial effects to be solved by this invention clearer and more understandable, this invention is described in further detail hereinafter in conjunction with the accompanying drawings and embodiments. It should be understood that the specific embodiments described herein are intended only to explain the present invention and are not intended to limit it.

It is noted that when an element is said to be "fixed to" or "set on" another element, it may be directly on the other element or indirectly on the other element. When an element is said to be "attached" to another element, it may be directly attached to the other element or indirectly attached to the other element.

"front", "back", "left", "right", "vertical", "horizontal", "top", "bottom", "inside", "outside", etc. The orientation or positional relationships indicated by "outside" and the like are based on the orientation or positional relationships shown in the accompanying drawings and are intended only to facilitate and simplify the description of this invention, not to indicate or imply that the device or element referred to must have a particular orientation, be constructed and operate in a particular orientation, and therefore are not to be construed as limiting the invention.

In addition, the terms "first" and "second" are used for descriptive purposes only, and are not to be construed as indicating or implying relative importance or implicitly specifying the number of technical features indicated. Thus, the features qualified with "first" and "second" may explicitly or implicitly include one or more such features. In the description of this invention, "plurality" means two or more, unless otherwise expressly and specifically limited.

The detection device according to the present invention will be described in the following embodiments.

With reference to FIGS. 1-5, in the present embodiment the detection device comprises a housing 10, a wall detection assembly 20, a multimeter assembly 30, and a circuit setting layer 40, wherein the wall detection assembly 20 comprises a wall detection processing circuit 201 and a sensor assembly 202, the multimeter assembly 30 comprises a multimeter measurement circuit 301, the circuit setting layer 40 and the sensor assembly 202 are both located inside the housing 10.

In this embodiment, the housing 10 comprises a top housing 101 and a bottom housing 102 that fit together along a first direction, the circuit setting layer 40 has a first setting surface 401 facing the bottom housing 102, the first setting surface 401 has a first setting area 401a and a second setting area 401b partitioned thereon along a second direction; the wall detection processing circuit 201 is located in the first setting area 401a, the multimeter measurement circuit 301 is located in the second setting area 401b, the sensor assembly 202 is located in the bottom housing 102, and the sensor assembly 202 is positioned opposite the first setting area 401a; the first direction and the second direction form an angle or preferably are pedicular.

As shown in FIG. 1, the first direction is the height direction of the detection device, and the second direction is the length direction of the detection device.

The sensor assembly 202 is electrically connected to the wall detection processing circuit 201, the sensor assembly 202 is configured to obtain detection parameters of a wall to be detected and transmit the detection parameters to the wall detection processing circuit 201 for processing, and the multimeter measurement circuit 301 is configured to receive detection signals from test leads of multimeter and process the detection signals.

Compared to the prior art, the detection device provided in this embodiment includes a housing 10, a wall detection assembly 20, a multimeter assembly 30, and a circuit setting layer 40, with the wall detection assembly 20 and multimeter assembly 30 integrated and arranged in the housing 10. The housing 10 includes a top housing 101 and a bottom housing 102 that mate with each other along a first direction, while the circuit setting layer 40 has a first setting surface 401 facing the bottom housing 102. The first setting surface 401 has a first setting area 401a and a second setting area 401b partitioned along a second direction.

Therefore, the wall detection processing circuit 201 is placed in the first setting area 401a, while the multimeter measurement circuit 301 is placed in the second setting area 401b, based on the circuit setting layer 40 as the base layer, in order to separate the parts that may interfere with each other in the wall detection assembly 20 and the multimeter assembly 30 into two different areas, thereby isolating the mutual interference and adverse effects of the two different detection functions. The sensor assembly 202 is placed in the bottom housing 102, and is spaced apart from the first setting area 401a, in order to avoid adverse effects of the circuit structure on the sensing and detection of the sensor assembly 202, thereby achieving the integration of wall detection and multimeter functions in a single device.

The beneficial effects of the detection device provided in this embodiment are:

Firstly, the circuit setting layer 40 is used as the base layer to isolate and prevent interference between the wall detection assembly 20 and the multimeter assembly 30, which have interfering parts in different areas, thereby achieving the integration of wall detection and multimeter functions in one device without interference.

Secondly, the integration of wall detection and multimeter functions in one device reduces the workload of the operator who no longer needs to hold two devices separately for wall detection, which is advantageous for simplifying work and reducing the weight of the load.

Thirdly, in the preparation work of the detection operation, there is no need to separately purchase a wall detection instrument and a digital multimeter, which reduces the user's purchasing cost and increases the portability of the device.

Figure 3:
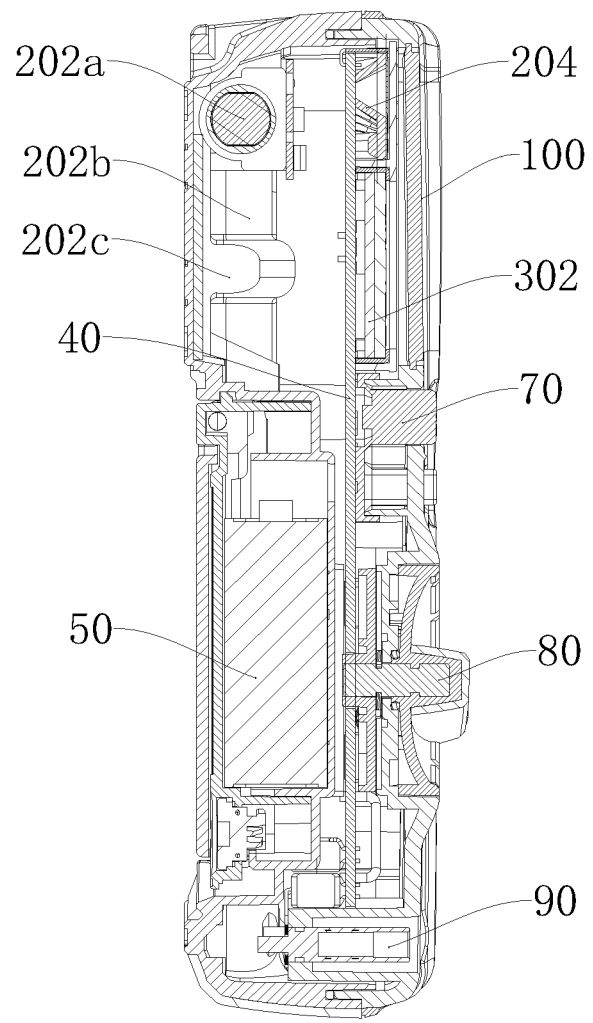
FIG. 3 is a cross-sectional view of FIG. 2 along the A-A direction.

Referring to FIG. 3, in one embodiment, the sensor assembly 202 and the wall detection processing circuit 201 are spaced apart along a first direction and there is a gap between them. In this way, the sensor assembly 202 and the wall detection processing circuit 201 are spaced apart along the above-mentioned second direction to ensure that the sensor assembly 202 and the circuit structure do not interfere with each other, further reducing the impact of the circuit structure on the induction signal, and further improving the sensitivity and stability of the induction detection.

In one embodiment, the sensor assembly 202 includes at least one of a metal detection sensing element 202a, a foreign object detection sensing element 202b, and an AC voltage signal sensing element 202c. The wall detection processing circuit 201 includes a wall detection control unit 201a, and at least one of a metal detection processing circuit 201b, a foreign object detection processing circuit 201c, and an AC voltage signal processing circuit 201d, which are electrically connected to the wall detection control unit 201a.

The selection of the metal detection sensing element 202a, foreign object detection sensing element 202b, and AC voltage signal sensing element 202c can be specifically set according to the needs of the wall to be detected. Correspondingly, the selection of the metal detection processing circuit 201b, foreign object detection processing circuit 201c, and AC voltage signal processing circuit 201d can be specifically set according to the type of sensing element.

The embodiments of this invention don't specify the type and quantity of sensing elements in the wall detection component 20, as well as the type and quantity of processing circuits corresponding to the sensing elements. According to the requirements of the detected parameters of the wall to be detected, those skilled in the art can adaptively increase or decrease the type and quantity of sensing elements according to specific needs. Correspondingly, the selection of sensing element types and quantities can also adaptively increase or decrease the processing circuits. Increasing or decreasing to adapt to the needs of the detected wall is within the scope of protection of this invention.

Figure 4:
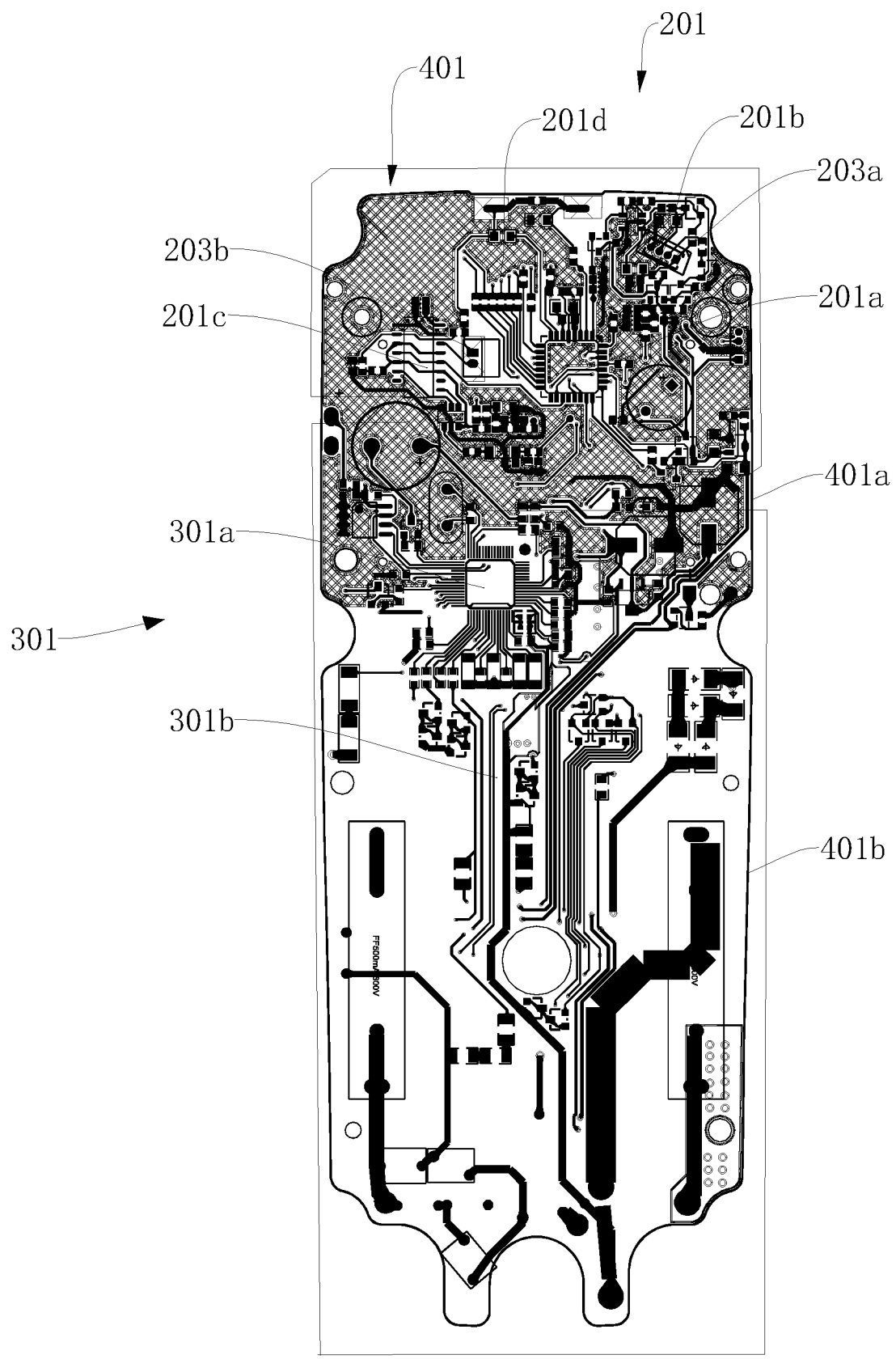
FIG. 4 is a schematic view of the first setting surface of the circuit setting layer provided by an embodiment the present invention.

Referring to FIGS. 1, 3, and 4, in a preferred embodiment, the preferred sensor assembly 202 includes a metal detection sensing element 202a, a foreign object detection sensing element 202b, and an AC voltage signal sensing element 202c. The wall detection processing circuit 201 includes a wall detection control unit 201a, and metal detection processing circuit 201b, a foreign object detection processing circuit 201c, and an AC voltage signal processing circuit 201d, which are respectively electrically connected to the wall detection control unit 201a.

The metal detection sensing element 202a is electrically connected to the metal detection processing circuit 201b and is used to obtain and transmit the metal parameters of the wall to be detected to the metal detection processing circuit 201b. The detection purpose of the metal detection sensing element 202a is to detect whether there is a metal structure or substance in the area to be detected in the wall to be detected.

The foreign object detection sensing element 202b is electrically connected to the foreign object detection processing circuit 201c and is used to obtain and transmit the foreign object parameters of the wall to be detected to the foreign object detection processing circuit 201c. The detection purpose of the foreign object detection sensing element 202b is to detect whether there are foreign objects, including but not limited to wooden battens, metal pipes, wire pipes and other substances, in the area to be detected in the wall to be detected.

The AC voltage signal sensing element 202c is electrically connected to the AC voltage signal processing circuit 201d and is used to obtain and transmit the AC voltage signal parameters of the wall to be detected to the AC voltage signal processing circuit 201d. The detection purpose of the AC voltage signal sensing element is to detect whether there is a circuit structure in the area to be detected in the wall to be detected.

In a preferred embodiment, the foreign object detection sensing element 202b and the AC voltage signal sensing element 202c are integrated and arranged together. The wall detection processing circuit 201 also includes a first interface structure 203a and a second interface structure 203b located in the first setting area 401a. Of course, in other embodiments, the foreign object detection sensing element 202b and the AC voltage signal sensing element 202c can be separately arranged.

The metal detection sensing element 202a is electrically connected to the first interface structure 203a through a wire, and the first interface structure 203a is electrically connected to the metal detection processing circuit 201b. The foreign object detection sensing element 202b is electrically connected to the second interface structure 203b through a wire, and the AC voltage signal sensing element 202c is also electrically connected to the second interface structure 203b through a wire. The second interface structure 203b is electrically connected to the AC voltage signal processing circuit 201d.

In the embodiments of the present invention, connecting wires and interface structures are preferably used to connect the sensing elements and processing circuits to ensure reliable signal transmission, and to improve the sensitivity and stability of the induction signal.

In the present embodiment, the wall detection control unit 201a is preferably a microcontroller. The wall detection control unit 201a is located in the central area of the first setting area 401a, and the metal detection processing circuit 201b and AC voltage signal processing circuit 201d are located in the area of the first setting area 401a away from the second setting area 401b. Since the detection purpose of the metal detection sensing element 202a is to detect whether there is a metal structure or substance in the area to be detected inside the wall to be detected, and the detection purpose of the AC voltage signal sensing element is to detect whether there is a circuit structure in the area to be detected inside the wall to be detected, the two are set in an area far away from the multimeter measurement circuit 301 to further ensure that the mutual interference and adverse effects between the wall detection part and the multimeter part can be avoided, that is, the upper part of the area in FIG. 5.

Furthermore, the metal detection processing circuit 201b, foreign object detection processing circuit 201c, and AC voltage signal processing circuit 201d are sequentially arranged on the outside of the wall detection control unit 201a in a clockwise direction. This layout allows the wall detection processing circuit 201 to be arranged regularly on the basis of the partition setting of the wall detection processing circuit 201 and the multimeter measurement circuit 301.

Referring to FIG. 3, in one embodiment, the multimeter measurement circuit 301 includes a multimeter control unit 301a and a multimeter processing circuit 301b electrically connected to the multimeter control unit 301a. The multimeter control unit 301a is located in an area near the first setting area 401a on the second setting surface 402, and the multimeter measurement circuit 301 is located in an area far from the first setting area 401a on the second setting surface 402. In the multimeter assembly 30, the multimeter processing circuit 301b receives detection signals from the test lead of the multimeter and processes the signals. To further avoid interference with the wall detection processing circuit 201, the multimeter processing circuit 301b is set in an area further away from the wall detection processing circuit 201, specifically in the lower part of the area shown in FIG. 5.

Referring to FIG. 1, in one embodiment, the bottom housing 102 is constructed with a first holding slot on the side facing the top housing 101, and a second holding slot on the side opposite to the top housing 101. Both the first holding slot and the second holding slot have an open end and are spaced apart along a second direction. The detection device further includes a battery structure 50 and a battery housing 103, which supply power to the wall detection assembly 20 and the multimeter assembly 30.

In this embodiment, the first holding slot is located opposite to the first setting area 401a, and the second holding slot is located opposite to the second setting area 401b. The sensor assembly 202 is located inside the first holding slot and is installed on the bottom wall of the first holding slot. The circuit setting layer 40 is placed on the open end of the first holding slot, covering the open end, and the top housing 101 and the bottom housing 102 are merged to close the open end of the first holding slot.

In a preferred embodiment, the metal detection sensing element 202a includes a metal detection sensor and an installation board assembly, as well as an intermediate circuit installed on the installation board assembly. The metal detection sensor is integrated and set on the intermediate circuit, and the intermediate circuit is electrically connected to the first interface structure 203a via wire conductivity.

In this embodiment, the entire metal detection sensing element 202a can be clamped or adhered to the bottom wall of the first housing cavity through the installation board assembly, avoiding the use of metal fasteners to install the metal detection sensing element 202a, which could adversely affect the acquisition and transmission of the induction detection signal, thereby improving the sensitivity and stability of the detection signal.

Furthermore, on the mounting panel assembly and the bottom wall of the first housing slot 102a, there are respectively mutually matching card mounting structures. The mounting panel assembly and the first housing slot 102a are mutually connected by card mounting structures that are adapted to each other. The metal detection sensing element 202a can be installed as a whole in the first housing slot 102a, or removed from the first housing slot 102a. By improving the sensitivity and stability of the detection signal, the convenience of disassembly and assembly of the metal detection sensing element 202a is increased.

In a preferred embodiment, the foreign object detection sensing element 202b and AC voltage signal sensing element 202c are integrated and set together. The structure they are integrated into includes a foreign object detection sensor, an AC voltage signal sensor, and an intermediate circuit board. The foreign object detection sensor and AC voltage signal sensor are integrated onto the intermediate circuit board, and the integrated structure is fixed to the bottom wall of the first holding slot 102a by snapping or bonding to avoid using metal fasteners to install the metal detection sensing element 202a, which could adversely affect the acquisition and transmission of induction detection signals and thereby improve the sensitivity and stability of the detection signal.

Furthermore, in a further preferred embodiment, the structure integrated with the foreign object detection sensing element 202b and AC voltage signal sensing element 202c is fixed to the bottom wall of the first holding slot 102a by bonding, and the region where the integrated structure is fixed is a flat wall structure. Both the inner and outer sides of the flat wall structure are flat surfaces, which makes it easier to bond the integrated structure to the flat inner surface and allows the integrated structure to be fitted against the wall to be detected through the flat outer surface to complete the detection.

The battery structure 50 is located inside the second holding compartment and is secured by the battery housing 103 to one side of the bottom housing 102, away from the top housing 101, thus closing the opening of the second holding compartment. Therefore, the sensing components 202, circuit structures, and battery structure 50 used in the detection device are all enclosed within the housing 10 that provides power to the circuit structure.

In a preferred embodiment, the wall detection assembly 20 further includes a first linear regulator, and the multimeter assembly 30 further includes a second linear regulator. The wall detection processing circuit 201 is electrically connected to the battery structure 50 through the first linear regulator, and the multimeter measurement circuit 301 is electrically connected to the battery structure 50 through the second linear regulator.

In this preferred embodiment, the wall detection processing circuit 201 and the multimeter measurement circuit 301 are electrically connected to the battery structure 50 through different first and second linear regulators, respectively. That is, the wall detection part and the multimeter part are powered independently from the battery structure 50 through separate linear regulators, in order to reduce the influence of supply voltage on each other.

Referring to FIG. 1 and FIG. 3, in one embodiment, the wall detection assembly 20 further includes a first display device 204, a wall detection processing circuit 201, and a first display device 204 electrically connected. Specifically, the wall detection control unit 201a in the wall detection processing circuit 201 is electrically connected to the first display device 204, and the first display device 204 is used to display the characteristic parameters processed by the wall detection processing circuit 201 for the detection parameters, such as the symbols for metal detection, foreign object detection, AC voltage detection mode, range, low voltage symbol, and detection signal strength, etc., in an analog-to-digital conversion display.

In this embodiment, the multimeter assembly 30 also includes a second display device 302, a multimeter measurement circuit 301, and a second display device 302 electrically connected. Specifically, the multimeter control unit 301a in the multimeter measurement circuit 301 is electrically connected to the second display device 302, and the second display device 302 is used to display the characteristic signals processed by the multimeter measurement circuit 301 for the detection signals, such as displaying the data for AC/DC voltage, current, resistance, capacitance, temperature, etc.

In this embodiment, the first display device 204 is used to display the characteristic parameters processed by the wall detection processing circuit 201 for the detection parameters, while the second display device 302, independent of the first display device 204, is used to display the characteristic signals processed by the multimeter measurement circuit 301 for the detection signal. This makes it convenient for detection workers to read characteristic readings from different detection parts through different display devices, further improving the usability of the detection equipment.

Both the first display device 204 and the second display device 302 are preferably LCD screens. More preferably, the first display device 204 is an LED LCD screen, and the second display device 302 is an LCD screen.

Furthermore, in a preferred embodiment, the first display device 204 and the second display device 302 are both arranged on the side of the top housing 101, away from the bottom housing 102. The first display device 204 corresponds to the first setting area 401*a*, and the second display device 302 corresponds to the second setting area 401*b*. The first display device 204 and the second display device 302 are arranged in succession along the second direction, i.e., the vertical direction shown in FIG. 3, to reasonably utilize the space on the front surface of the top housing 101.

In this embodiment, the first display device 204 is preferably located near the top of the front surface of the top housing 101, and the second display device 302 is arranged immediately below the first display device 204 in the vertical direction and spaced apart from the first display device 204. This facilitates the operator to conveniently read the displayed readings.

Regarding the installation of the first display device 204 and the second display device 302, in this embodiment, the first display device 204 and the second display device 302 are installed on the mounting panel 60, and the entire module of the mounting panel 60 and the display devices is installed on the front surface of the top housing 101. The first display device 204 and the second display device 302 are installed on the mounting panel 60 through a transparent cover plate 100.

Figure 5:
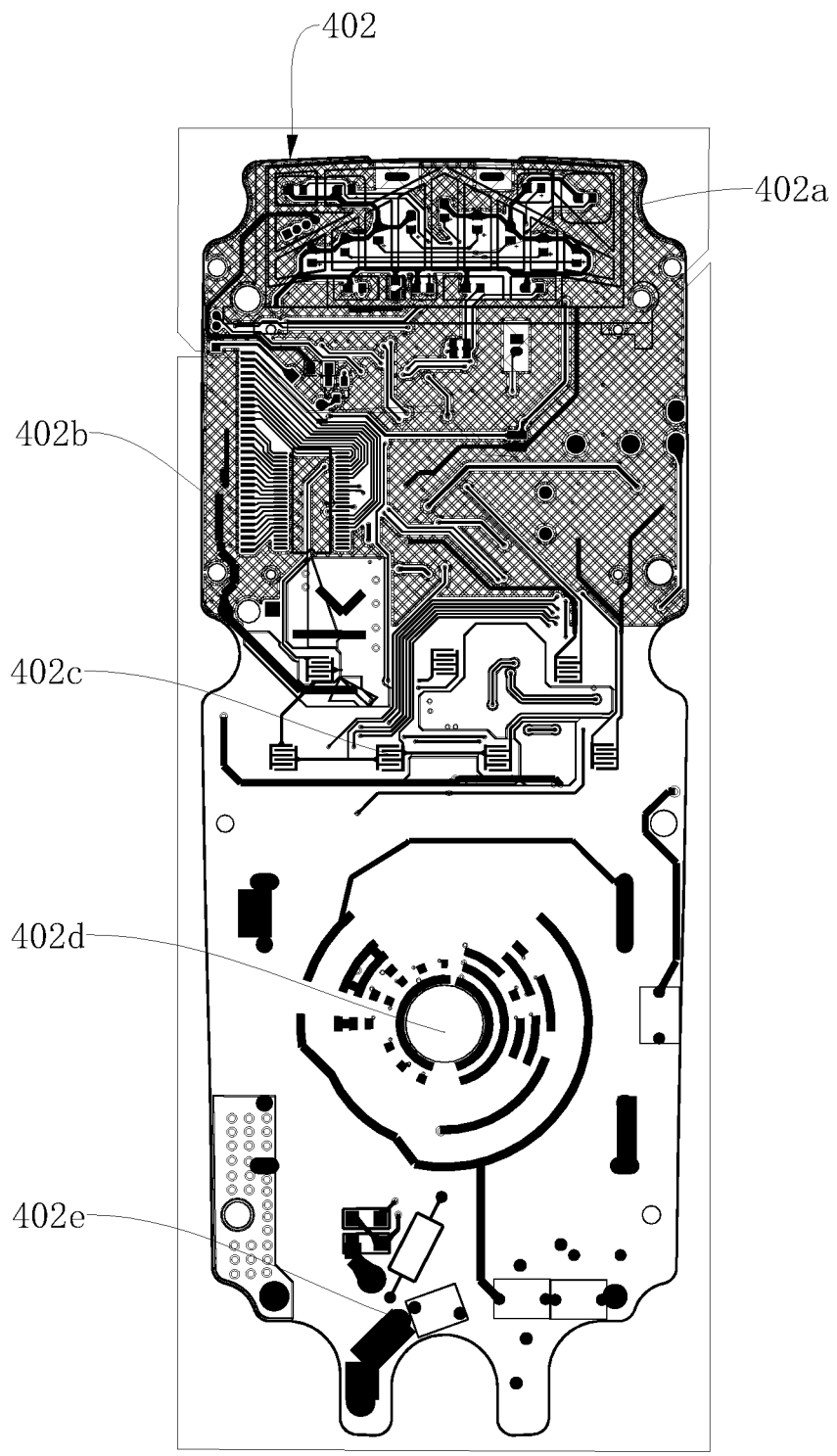
FIG. 5 is a schematic diagram of a second setting surface of the circuit setting layer provided by an embodiment the present invention.

Referring to FIG. 5, in the present embodiment of the invention, the circuit setting layer 40 has a second setting surface 402 that is opposite to the first setting surface 401, and along the second direction, the second setting surface 402 sequentially has a first display control area 402*a*, a second display control area 402*b*, a keypad control area 402*c*, a rotary knob 80 control area, and a test lead contact control area 402*e*. The first display control area 402*a* is provided for connecting and controlling the first display device 204, the second display control area 402*b* is provided for connecting and controlling the second display device 302, the keypad control area 402*c* is provided for connecting and controlling the keypad, the rotary knob 80 control area is provided for connecting and controlling the rotary knob 80, and the test lead contact control area 402*e* is provided for inserting the test lead and transmitting the test lead electrical signal.

Referring to FIGS. 1 and 3, in the present embodiment of the invention, the top housing 101's front surface is sequentially equipped with the first display device 204, the second display device 302, keypad assembly 70, rotary knob 80, and input terminals for test lead 90 along the second direction mentioned above.

The keypad assembly 70 includes SEL key, ON/OFF key, and RANGE/CAL key. The SEL key is used for selecting the detection mode, providing three detection modes for metal, foreign object, and AC voltage. The ON/OFF key is used for turning on/off the wall detection function. The RANGE/CAL key is used for setting the detection mode range and calibration, and these three keys are only used for wall detection function. The keypad assembly 70 also includes MODE key, RANGE key, and MAX/MIN key. The MODE key is used for selecting the multimeter function, the RANGE key is used for setting the micro-range, and the MAX/MIN key is used for measuring the maximum and minimum values. The keypad assembly 70 also includes Hold key and LCD backlight switch key.

The input terminals for test lead 90 include three test lead plug-ins, including a 10A current range input terminal, a common input terminal, and a positive input plug-in.

It should be noted that the above keypad assembly 70, rotary knob 80, and input terminals for test lead 90 are all existing technologies, and the present embodiment of the invention does not elaborate on them in detail.

In one embodiment, the circuit setting layer 40 has a grid structure and is made of a copper hollow layer. By using a grid-shaped copper hollow layer as the circuit structure, interference between signals can be further reduced to avoid using solid copper which may have a larger impact on the detection signals of the metal detection sensing element 202*a*.

The above is only the preferred embodiment of the present invention, and is not intended to limit the present invention. Any modifications, equivalent replacements, improvements, etc. made within the spirit and principles of the present invention should be included within the scope of protection of the present invention.

The invention claimed is:

1. A detection device comprising a housing (10), a wall detection assembly (20), a multimeter assembly (30), and a circuit setting layer (40), wherein the wall detection assembly (20) comprises a wall detection processing circuit (201) and a sensor assembly (202), the multimeter assembly (30) comprises a multimeter measurement circuit (301), the circuit setting layer (40) and the sensor assembly (202) are both located inside the housing (10);

the housing (10) comprises a top housing (101) and a bottom housing (102) that fit together, the circuit setting layer (40) has a first setting surface (401) facing the bottom housing (102), the first setting surface (401) has a first setting area (401*a*) and a second setting area (401*b*) partitioned thereon; the wall detection processing circuit (201) is located in the first setting area (401*a*), the multimeter measurement circuit (301) is located in the second setting area (401*b*), the sensor assembly (202) is located in the bottom housing (102), and the sensor assembly (202) is positioned opposite the first setting area (401*a*);

the sensor assembly (202) is electrically connected to the wall detection processing circuit (201), the sensor assembly (202) is configured to obtain detection parameters of a wall to be detected and transmit the detection parameters to the wall detection processing circuit (201) for processing, and the multimeter measurement circuit (301) is configured to receive detection signals from test leads of multimeter and process the detection signals; and the sensor assembly (202) and the wall detection processing circuit (201) are spaced apart along a direction in which the top housing and the bottom housing are engaged, and the sensor assembly (202) and the wall detection processing circuit (201) form a gap therebetween.

2. The detection device according to claim 1, characterized in that:

the bottom housing (102) has a first housing cavity on a surface facing the top housing (101) and a second housing cavity on a surface opposing the top housing (101), and the first housing cavity and the second housing cavity are spaced apart, the detection device further comprising a battery structure (50), which supplies power to the wall detection assembly (20) and the multimeter assembly (30);

wherein the first housing cavity is located opposite to the first setting area (401*a*) and the second housing cavity is located opposite to the second setting area (401*b*), the sensor assembly (202) is located inside the first housing cavity and mounted on the bottom wall of the first housing cavity, and the battery structure (50) is located inside the second housing cavity.

3. The detection device according to claim 2, characterized in that:
the wall detection assembly (20) further comprises a first linear regulator, the multimeter assembly (30) further comprises a second linear regulator, the wall detection processing circuit (201) is electrically connected to the battery structure (50) via the first linear regulator, and the multimeter measurement circuit (301) is electrically connected to the battery structure (50) via the second linear regulator.

4. The detection device according to claim 2, characterized in that:
the wall detection assembly (20) further comprises a first display device (204), the wall detection processing circuit (201) is electrically connected to the first display device (204), and the first display device (204) is configured to display the characteristic parameters processed by the wall detection processing circuit (201) for the detection parameters; the multimeter assembly (30) further comprises a second display device (302), the multimeter measurement circuit (301) is electrically connected to the second display device (302), and the second display device (302) is configured to display characteristic signals processed by the multimeter measurement circuit (301) for the detection signals;
and in that the first display device (204) and the second display device (302) are both provided on a lateral side of the top housing (101) away from the bottom housing (102), the first display device (204) and the second display device (302) being arranged in sequence, the first display device (204) corresponding to the first setting area (401*a*) and the second display device (302) corresponding to the second setting area (401*b*).

5. The detection device as claimed in claim 2, characterized in that:
the circuit setting layer (40) is a grid structure; and
the circuit setting layer (40) is a copper hollow layer.

6. A detection device comprising a housing (10), a wall detection assembly (20), a multimeter assembly (30), and a circuit setting layer (40), wherein the wall detection assembly (20) comprises a wall detection processing circuit (201) and a sensor assembly (202), the multimeter assembly (30) comprises a multimeter measurement circuit (301), the circuit setting layer (40) and the sensor assembly (202) are both located inside the housing (10);
the housing (10) comprises a top housing (101) and a bottom housing (102) that fit together, the circuit setting layer (40) has a first setting surface (401) facing the bottom housing (102), the first setting surface (401) has a first setting area (401*a*) and a second setting area (401*b*) partitioned thereon; the wall detection processing circuit (201) is located in the first setting area (401*a*), the multimeter measurement circuit (301) is located in the second setting area (401*b*), the sensor assembly (202) is located in the bottom housing (102), and the sensor assembly (202) is positioned opposite the first setting area (401*a*);
the sensor assembly (202) is electrically connected to the wall detection processing circuit (201), the sensor assembly (202) is configured to obtain detection parameters of a wall to be detected and transmit the detection parameters to the wall detection processing circuit (201) for processing, and the multimeter measurement circuit (301) is configured to receive detection signals from test leads of multimeter and process the detection signals;
the sensor assembly (202) includes a metal detection sensing element (202*a*), a foreign object detection sensing element (202*b*), and an AC voltage signal sensing element (202*c*); the wall detection processing circuit (201) includes a wall detection control unit (201*a*), a metal detection processing circuit (201*b*), a foreign object detection processing circuit (201*c*), and an AC voltage signal processing circuit (201*d*); the metal detection processing circuit (201*b*), the foreign object detection processing circuit (201*c*), and the AC voltage signal processing circuit (201*d*) are respectively electrically connected to the wall detection control unit (201*a*);
wherein the metal detection sensing element (202*a*) is electrically connected to the metal detection processing circuit (201*b*), and the metal detection sensing element (202*a*) is used to obtain metal parameters of the wall to be detected and transmit them to the metal detection processing circuit (201*b*);
the foreign object detection sensing element (202*b*) is electrically connected to the AC voltage signal sensing element (202*c*), and the foreign object detection sensing element (202*b*) is used to obtain foreign object parameters of the wall to be detected and transmit them to the foreign object detection processing circuit (201*c*);
the AC voltage signal sensing element (202*c*) is electrically connected to the AC voltage signal processing circuit (201*d*), and the AC voltage signal sensing element (202*c*) is used to obtain an AC voltage signal of the wall to be detected and transmit it to the AC voltage signal processing circuit (201*d*);
the foreign object detection sensing element (202*b*) and the AC voltage signal sensing element (202*c*) are configured to be formed in one component, and the wall detection processing circuit (201) further includes a first interface structure (203*a*) and a second interface structure (203*b*) which are arranged in the first setting area (401*a*); and
wherein the metal detection sensing element (202*a*) is electrically connected to the metal detection processing circuit (201*b*) via the first interface structure (203*a*), the foreign object detection sensing element (202*b*) is electrically connected to the foreign object detection processing circuit (201*c*) via the second interface structure (203*b*), and the AC voltage signal sensing element (202*c*) is electrically connected to the AC voltage signal processing circuit (201*d*) via the second interface structure (203*b*).

7. The detection device according to claim 6, characterized in that:
the bottom housing (102) has a first housing cavity on a surface facing the top housing (101) and a second housing cavity on a surface opposing the top housing (101), and the first housing cavity and the second housing cavity are spaced apart, the detection device further comprising a battery structure (50), which supplies power to the wall detection assembly (20) and the multimeter assembly (30);
wherein the first housing cavity is located opposite to the first setting area (401*a*) and the second housing cavity is located opposite to the second setting area (401*b*), the sensor assembly (202) is located inside the first housing cavity and mounted on the bottom wall of the first housing cavity, and the battery structure (50) is located inside the second housing cavity.

8. A detection device comprising a housing (10), a wall detection assembly (20), a multimeter assembly (30), and a circuit setting layer (40), wherein the wall detection assembly (20) comprises a wall detection processing circuit (201) and a sensor assembly (202), the multimeter assembly (30) comprises a multimeter measurement circuit (301), the circuit setting layer (40) and the sensor assembly (202) are both located inside the housing (10);
- the housing (10) comprises a top housing (101) and a bottom housing (102) that fit together, the circuit setting layer (40) has a first setting surface (401) facing the bottom housing (102), the first setting surface (401) has a first setting area (401*a*) and a second setting area (401*b*) partitioned thereon; the wall detection processing circuit (201) is located in the first setting area (401*a*), the multimeter measurement circuit (301) is located in the second setting area 401*b*, the sensor assembly (202) is located in the bottom housing (102), and the sensor assembly (202) is positioned opposite the first setting area (401*a*);
- the sensor assembly (202) is electrically connected to the wall detection processing circuit (201), the sensor assembly (202) is configured to obtain detection parameters of a wall to be detected and transmit the detection parameters to the wall detection processing circuit (201) for processing, and the multimeter measurement circuit (301) is configured to receive detection signals from test leads of multimeter and process the detection signals;
- the sensor assembly (202) includes a metal detection sensing element (202*a*), a foreign object detection sensing element (202*b*), and an AC voltage signal sensing element (202*c*); the wall detection processing circuit (201) includes a wall detection control unit (201*a*), a metal detection processing circuit (201*b*), a foreign object detection processing circuit (201*c*), and an AC voltage signal processing circuit (201*d*); the metal detection processing circuit (201*b*), the foreign object detection processing circuit (201*c*), and the AC voltage signal processing circuit (201*d*) are respectively electrically connected to the wall detection control unit (201*a*);
- wherein the metal detection sensing element (202*a*) is electrically connected to the metal detection processing circuit (201*b*), and the metal detection sensing element (202*a*) is used to obtain metal parameters of the wall to be detected and transmit them to the metal detection processing circuit (201*b*);
- the foreign object detection sensing element (202*b*) is electrically connected to the AC voltage signal sensing element (202*c*), and the foreign object detection sensing element (202*b*) is used to obtain foreign object parameters of the wall to be detected and transmit them to the foreign object detection processing circuit (201*c*);
- the AC voltage signal sensing element (202*c*) is electrically connected to the AC voltage signal processing circuit (201*d*), and the AC voltage signal sensing element (202*c*) is used to obtain an AC voltage signal of the wall to be detected and transmit it to the AC voltage signal processing circuit (201*d*);
- the wall detection control unit (201*a*) is located in central area of the first setting area (401*a*), and the metal detection processing circuit (201*b*) and the AC voltage signal processing circuit (201*d*) are located in the area of the first setting area (401*a*) away from the second setting area (401*b*);
- and in that the metal detection processing circuit (201*b*), the foreign object detection processing circuit (201*c*), and the AC voltage signal processing circuit (201*d*) are sequentially arranged outside the wall detection control unit (201*a*) in a clockwise direction.

9. The detection device according to claim 8, characterized in that:
- the multimeter measurement circuit (301) comprises a multimeter control unit (301*a*) and a multimeter processing circuit (301*b*) electrically connected to the multimeter control unit (301*a*);
- and in that the multimeter control unit (301*a*) is located in an area on the second setting area (401*b*) near the first setting area (401*a*), and the multimeter measurement circuit (301) is located in an area on the second setting area (401*b*) away from the first setting area (401*a*).

10. The detection device according to claim 9, characterized in that:
- the bottom housing (102) has a first housing cavity on a surface facing the top housing (101) and a second housing cavity on a surface opposing the top housing (101), and the first housing cavity and the second housing cavity are spaced apart, the detection device further comprising a battery structure (50), which supplies power to the wall detection assembly (20) and the multimeter assembly (30);
- wherein the first housing cavity is located opposite to the first setting area (401*a*) and the second housing cavity is located opposite to the second setting area (401*b*), the sensor assembly (202) is located inside the first housing cavity and mounted on the bottom wall of the first housing cavity, and the battery structure (50) is located inside the second housing cavity.

11. The detection device according to claim 8, characterized in that:
- the bottom housing (102) has a first housing cavity on a surface facing the top housing (101) and a second housing cavity on a surface opposing the top housing (101), and the first housing cavity and the second housing cavity are spaced apart, the detection device further comprising a battery structure (50), which supplies power to the wall detection assembly (20) and the multimeter assembly (30);
- wherein the first housing cavity is located opposite to the first setting area (401*a*) and the second housing cavity is located opposite to the second setting area (401*b*), the sensor assembly (202) is located inside the first housing cavity and mounted on the bottom wall of the first housing cavity, and the battery structure (50) is located inside the second housing cavity.

\* \* \* \* \*